United States Patent
Kimura

(10) Patent No.: US 11,357,133 B2
(45) Date of Patent: Jun. 7, 2022

(54) ELECTRONIC DEVICE FOR AIRCRAFT

(71) Applicant: NABTESCO CORPORATION, Tokyo (JP)

(72) Inventor: Hisanobu Kimura, Tokyo (JP)

(73) Assignee: NABTESCO CORPORATION, Tokyo (JP)

( * ) Notice: Subject to any disclaimer, the term of this patent is extended or adjusted under 35 U.S.C. 154(b) by 0 days.

(21) Appl. No.: 17/085,769

(22) Filed: Oct. 30, 2020

(65) Prior Publication Data

US 2021/0161030 A1 May 27, 2021

(30) Foreign Application Priority Data

Nov. 27, 2019 (JP) .............................. JP2019-214412

(51) Int. Cl.
*H05K 7/20* (2006.01)
*H05K 1/02* (2006.01)

(52) U.S. Cl.
CPC ....... *H05K 7/20445* (2013.01); *H05K 1/0203* (2013.01)

(58) Field of Classification Search
None
See application file for complete search history.

(56) References Cited

U.S. PATENT DOCUMENTS

| 6,249,442 | B1 * | 6/2001 | Watanabe | H05K 7/142 174/138 E |
| 8,339,773 | B2 * | 12/2012 | Frassineti | H02B 1/56 361/677 |
| 8,724,313 | B2 * | 5/2014 | Nakasaka | H05K 7/20927 361/679.46 |
| 10,028,409 | B1 * | 7/2018 | Metzler | H05K 7/20936 |
| 10,037,040 | B2 * | 7/2018 | Hervieux | G05G 11/00 |
| 2009/0122505 | A1 * | 5/2009 | Lu | H05K 1/0271 361/809 |
| 2012/0075607 | A1 | 3/2012 | Knarren et al. | |
| 2021/0176882 | A1 * | 6/2021 | Kimura | B64F 5/10 |

FOREIGN PATENT DOCUMENTS

JP 2005-300092 A 10/2005

OTHER PUBLICATIONS

Extended European Search Report dated Apr. 13, 2021, issued in corresponding European Patent Application No. EP 20203809.7 (10 pages).

* cited by examiner

*Primary Examiner* — Courtney L Smith
(74) *Attorney, Agent, or Firm* — Pillsbury Winthrop Shaw Pittman, LLP

(57) ABSTRACT

An electronic device includes: a casing including a bottom wall and a side wall rising from the bottom wall, the side wall being attached to a manifold of an actuator in an aircraft at an opposite side to the bottom wall; a boss projecting from the bottom wall toward the opposite side to the bottom wall with respect to the side wall; and a circuit portion fixed to the boss.

10 Claims, 2 Drawing Sheets

ELECTRONIC DEVICE FOR AIRCRAFT

CROSS-REFERENCE TO RELATED APPLICATIONS

This application is based on and claims the benefit of priority from Japanese Patent Application Serial No. 2019-214412 (filed on Nov. 27, 2019), the contents of which are hereby incorporated by reference in their entirety.

TECHNICAL FIELD

The present invention relates to an electronic device for an aircraft.

BACKGROUND

In the electronic device disclosed in Japanese Patent Application Publication No. 2005-300092 ("the '092 Publication"), a plurality of bosses project from a back surface of a refrigerator, which is a heating element. A circuit portion including a circuit board is fixed to the distal end surfaces of the plurality of bosses. A protective casing is attached to the back surface of the refrigerator so as to cover the circuit portion.

As in the '092 Publication, bosses projecting from a heating element conduct heat from the heating element directly to a circuit portion. This may cause the circuit portion to overheat due to a high temperature of the heating element.

SUMMARY

The present invention addresses such a drawback, and one object thereof is to prevent overheating of the circuit portion due to the heat from the heating element.

An electronic device for an aircraft for addressing the above drawback comprises: a casing including a bottom wall and a side wall rising from the bottom wall, wherein a heating element is attached to the side wall at an opposite side to the bottom wall; a boss projecting from the bottom wall toward the opposite side to the bottom wall with respect to the side wall; and a circuit portion fixed to the boss.

With the above arrangement, the heat from the heating element is conducted to the casing and passes through the side wall and the bottom wall of the casing to reach the boss and further the circuit portion. When the heat passes such a path, the heat is radiated from the casing while it is conducted through the casing. Accordingly, the amount of the heat reaching the circuit portion can be reduced to prevent overheating of the circuit portion.

The electronic device for an aircraft may further comprise a base provided between the casing and the heating element.

In the electronic device for an aircraft, the base may be made of a material having a lower thermal conductivity than the casing.

In the electronic device for an aircraft, a spacer may be attached to the base, and the base may be attached to the heating element via the spacer.

In the electronic device for an aircraft, the spacer may be made of a material having a lower thermal conductivity than the casing.

In the electronic device for an aircraft, the circuit portion may be fixed to a distal end surface of the boss, and a distance between the heating element and the distal end surface of the boss may be larger than a projection length of the boss from the bottom wall.

In the electronic device for an aircraft, a thickness of the side wall may be smaller than a thickness of the bottom wall.

In the electronic device for an aircraft, the casing may include a though-hole communicating between an inside and an outside of the casing.

In the electronic device for an aircraft, the boss may be positioned away from an edge of the bottom wall, and a distance between the boss and the edge of the bottom wall may be larger than a projection length of the boss.

An electronic device for an aircraft for addressing the above drawback comprises: a casing including a bottom wall and a side wall rising from the bottom wall, wherein a heating element is attached to the side wall at an opposite side to the bottom wall; a boss projecting from the bottom wall toward the opposite side to the bottom wall with respect to the side wall; a circuit portion fixed to a distal end surface of the boss; and a base provided between the casing and the heating element, wherein the base is made of a material having a lower thermal conductivity than the casing, and wherein a distance between the heating element and the distal end surface of the boss is larger than a projection length of the boss from the bottom wall.

With the above arrangement, the heat from the heating element is conducted to the casing through the base having a lower thermal conductivity, and passes through the side wall and the bottom wall of the casing to reach the boss and further the circuit portion. When the heat passes such a path, the heat is first inhibited by the base from being conducted from the heating element to the casing, and then the heat is radiated from the casing to an outside while it is conducted through the casing. Accordingly, the amount of the heat reaching the circuit portion can be reduced to prevent overheating of the circuit portion. In addition, since the base is interposed between the heating element and the casing, it can be prevented that the radiation heat from the heating element is conducted directly to the interior of the casing. Further, since the distance between the heating element and the boss is larger than a projection length of the boss, the circuit portion is positioned at a proper distance from the heating element. Therefore, the amount of the radiation heat from the heating element received by the circuit portion can be reduced. As a result, it can be prevented that the circuit portion overheats due to the heat from the heating element.

DESCRIPTION OF THE EMBODIMENTS

One embodiment of an aircraft actuator having an electronic device applied thereto will be hereinafter described with reference to the drawings.

Figure 1:
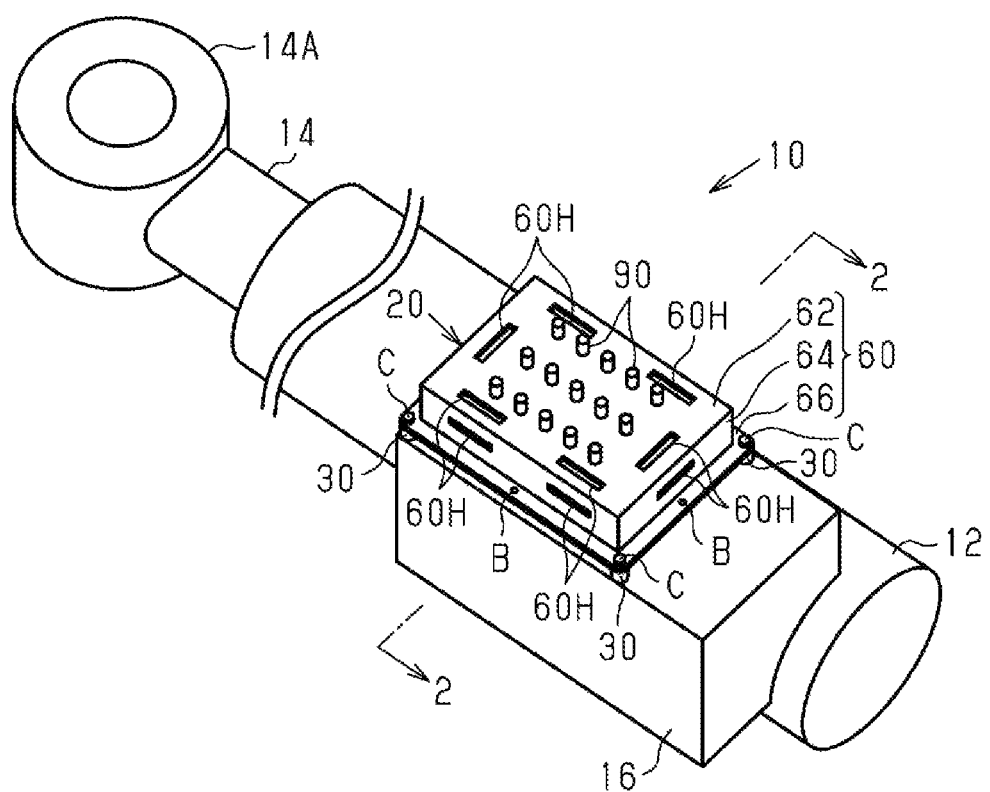
FIG. 1 is a perspective view of an aircraft actuator.

As shown in FIG. 1, an aircraft actuator 10 includes a cylinder 12 having a cylindrical shape. The interior of the cylinder 12 constitutes a fluid chamber for containing a hydraulic fluid which is fed into and discharged out of the fluid chamber. In the fluid chamber, a rod 14 having a columnar shape is positioned coaxially with the cylinder 12. The rod 14 reciprocates in the axial direction of the cylinder 12 in accordance with the hydraulic pressure of the hydraulic fluid. A part of the distal end side of the rod 14 projects from one end of the cylinder 12. The distal end portion of the rod 14 forms a mounting portion 14A to which an operating object to be operated by the aircraft actuator 10 is mounted.

The mounting portion 14A has an annular shape. The operating object is a flap of an aircraft. Although not shown, the other end portion of the cylinder 12 forms a mounting portion for engaging with a mounting object to which the aircraft actuator 10 is mounted. The mounting object is a main wing of the aircraft.

A manifold 16 is fixed to the outer surface of the cylinder 12. The manifold 16 contains a hydraulic circuit defined therein. The hydraulic circuit includes a solenoid valve or the like for switching the flow path in the hydraulic circuit. The hydraulic fluid for the hydraulic circuit is fed into and discharged out of the cylinder 12. The manifold 16 is a heating element that emits heat to an outside in accordance with the power applied to the solenoid valve and the temperature of the hydraulic fluid. The manifold 16 heats in accordance with the power applied to the solenoid valve and the temperature of the hydraulic fluid, and the outer surface of the manifold 16 may heat to 100° C. or higher. When the high temperature heat of the manifold 16 reaches a circuit portion 50 of an electronic device 20, the circuit portion 50 may overheat, and thus it needs to release the heat.

Figure 2:
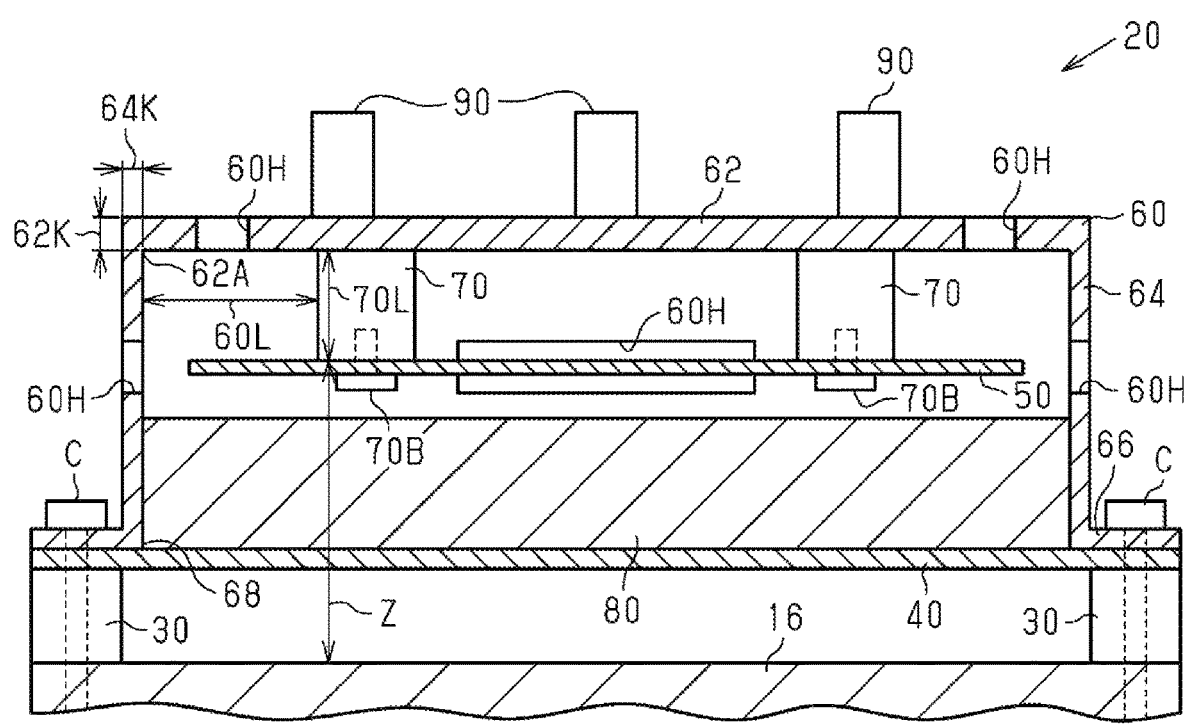
FIG. 2 is a cross-sectional view along the direction 2-2 in FIG. 1.

The electronic device 20 is attached to the outer surface of the manifold 16. A casing 60 of the electronic device 20 is a housing having an opening, and specifically, it is shaped like a quadrangular bottomed box. More specifically, the casing 60 has a bottom wall 62 shaped like a rectangular flat plate in plan view. As shown in FIG. 2, a side wall 64 rises from an edge 62A of the bottom wall 62, or an end surface thereof. The side wall 64 rises in the direction away from the bottom wall 62. FIG. 2 shows the rising direction of the side wall 64 downward from the bottom wall 62. The side wall 64 extends over the whole stretch of the edge 62A of the bottom wall 62. The side wall 64 rises the same length over its whole stretch along the edge 62A of the bottom wall 62. The side wall 64 also has the same thickness 64K over its whole stretch along the edge 62A of the bottom wall 62. The thickness 64K of the side wall 64 is smaller than the thickness 62K of the bottom wall 62. The distal end of the side wall 64 in its rising direction as a whole forms an edge of a quadrangular opening 68. In other words, the opening 68 of the casing 60 is provided on the opposite side to the bottom wall 62 with respect to the side wall 64. Further, a flange 66 projects outward from the distal end of the side wall 64 in its rising direction. The flange 66 extends over the whole stretch of the side wall 64. In other words, the flange 66 is shaped like a quadrangular frame in plan view from the opening 68 of the casing 60. The casing 60 is made of an aluminum alloy.

The walls of the casing 60 are penetrated by a plurality of through-holes 60H in the thickness direction of the walls. Specifically, among the walls of the casing 60, the side wall 64 has a plurality of through-holes 60H that communicate between the inside and the outside of the casing 60. As shown in FIG. 1, the plurality of through-holes 60H are arranged at intervals along the edge of the bottom wall 62. The plurality of through-holes 60H are disposed as follows. Each of the faces of the side wall 64 rising from the long sides of the edge 62A of the bottom wall 62 has two through-holes 60H, and each of the faces of the side wall 64 rising from the short sides has one through-hole 60H. The bottom wall 62 of the casing 60 also has a plurality of through-holes 60H that communicate between the inside and the outside of the casing 60. The plurality of through-holes 60H are positioned in the vicinity of the edge 62A of the bottom wall 62. The plurality of through-holes 60H are arranged at intervals along the edge 62A of the bottom wall 62. The plurality of through-holes 60H are disposed as follows. Each of the regions along the long sides of the edge 62A of the bottom wall 62 has two through-holes 60H, and each of the regions along the short sides has one through-hole 60H.

A plurality of fins 90 project from the outer surface of the bottom wall 62 toward the opposite side to the opening 68 of the casing 60. Each of the fins 90 has a columnar shape and rises from the bottom wall 62.

As shown in FIG. 2, a plurality of bosses 70 project from the inner surface of the bottom wall 62 toward the opening 68 of the casing 60. In other words, the bosses 70 project toward the side to which the side wall 64 rises from the bottom wall 62, or toward the opposite side to the bottom wall 62 with respect to the side wall 64. Each of the bosses 70 is shaped like a pillar and rises perpendicularly from the bottom wall 62. All the bosses 70 have the same projection length 70L. The projection length 70L of each of the bosses 70 is smaller than a half of the rise length of the side wall 64. Although not shown, each of the bosses 70 has a bolt hole formed in the distal end surface thereof toward the bottom wall 62.

Each of the bosses 70 is spaced apart from the edge 62A of the bottom wall 62 and positioned closer to the middle of the bottom wall 62 than are the through-holes 60H. The shortest distance 60L between each of the bosses 70 and the edge 62A of the bottom wall 62 is larger than the projection length 70L of the bosses 70.

The casing 60 contains a circuit portion 50 including a plate-shaped circuit board. FIG. 2 does not show components mounted on the circuit board in the circuit portion 50. The circuit portion 50 has a rectangular shape one size smaller than that of the bottom wall 62 of the casing 60 in plan view from the opening 68 of the casing 60. The circuit portion 50 is retained to the distal end surfaces of the bosses 70 and fixed to the bosses 70 with bolts 70B each corresponding to one of the bosses 70. Each of the bolts 70B, corresponding to one of the bosses 70, penetrates the circuit portion 50 and is screwed into the bolt hole of the boss 70.

The casing 60 also contains a heat insulator 80 made of a heat-insulating material. The heat insulator 80 is positioned on the opening 68 side of the circuit portion 50. The heat insulator 80 has a rectangular parallelepiped shape. In plan view from the opening 68 of the casing 60, the outer dimensions of the heat insulator 80 are the same as those of the bottom wall 62. The heat insulator 80 is fixed to the inner surface of the side wall 64 with an adhesive, for example. The heat insulator 80 is made of polyurethane.

A base 40 shaped like a rectangular plate is attached to the flange 66 of the casing 60. The outer dimensions of the base 40 are the same as the rectangular outer dimensions formed by the outer edge of the flange 66. In plan view from the opening 68 of the casing 60, the base 40 is positioned such that the four sides of the base 40 are aligned with the four sides of the flange 66. The base 40 and the flange 66 are fixed to each other with a bolt B provided for each side of the flange 66 shaped like a quadrangular frame. Since the base 40 is attached to the flange 66, the opening 68 of the casing 60 faces the base 40. The base 40 is made of a stainless steel. The base 40 is thus made of a material having a lower thermal conductivity than the casing 60.

Four spacers 30 are attached to the surface of the base 40 opposite to the casing 60. The spacers 30 are positioned at the four corners of the base 40. Each of the spacers 30 has a cylindrical shape. Each of the spacers 30 contacts with the base 40 at one end surface thereof. The spacers 30 are fixed to the base 40 with an adhesive, for example. The spacers 30 are made of a stainless steel. The spacers 30 are thus made of a material having a lower thermal conductivity than the casing 60.

Each of the spacers 30 contacts with the outer surface of the manifold 16 at the end surface thereof opposite to the base 40. Each of the spacers 30 is fixed to the manifold 16 with a bolt C provided therefor. Specifically, the bolts C are inserted through the four corners of the flange 66 of the casing 60, the four corners of the base 40, and the spacers 30. The bolts C are screwed into the manifold 16. In this way, the base 40 and the casing 60 are attached to the manifold 16 via the spacers 30. As described above, since the opening 68 of the casing 60 faces the base 40, the casing 60 is attached to the manifold 16 at the opening 68 side thereof via the base 40 and the spacers 30. In other words, the side wall 64 of the casing 60 is attached to the manifold 16 at the opposite side to the bottom wall 62. Since the projection length 70L of the bosses 70 is smaller than a half of the rise length of the side wall 64 of the casing 60, the distance Z between the outer surface of the manifold 16 and the distal end surfaces of the bosses 70 is larger than the projection length 70L of the bosses 70.

Operation of the embodiment will be now described. The heat in the outer surface of the manifold 16 reaches the electronic device 20 attached to the outer surface of the manifold 16. The heat in the manifold 16 follows the following path to reach the circuit portion 50 in the electronic device 20. The heat in the manifold 16 is conducted through the spacers 30 and the base 40 to the casing 60. The heat conducted to the casing 60 is conducted through the side wall 64 to the bottom wall 62 of the casing 60. In this way, the heat in the manifold 16 follows a properly long path to reach the circuit portion 50. Accordingly, the heat is radiated from the walls while it is conducted through the walls. After the heat is conducted to the bottom wall 62, it passes through the bosses 70 and reaches the circuit portion 50. The amount of the heat reaching the circuit portion 50 is properly small. Therefore, the amount of the heat conducted to the circuit portion 50 can be reduced.

Advantageous effects of the embodiment will be now described.

(1) The manifold 16 heats in accordance with the power applied to the solenoid valve and the temperature of the hydraulic fluid, and the outer surface of the manifold 16 may heat to 100° C. or higher. When the high temperature heat of the manifold 16 reaches the circuit portion 50 of the electronic device 20, the circuit portion 50 may overheat and break down.

In this embodiment, the heat in the manifold 16 follows a properly long path to reach the circuit portion 50. Further, the heat is radiated from the walls while it is conducted through the walls. Accordingly, the amount of the heat reaching the circuit portion 50 is properly small. Therefore, the amount of the heat conducted to the circuit portion 50 can be reduced.

(2) The casing 60 is made of an aluminum alloy for weight reduction. On the other hand, the spacers 30 are made of a stainless steel having a lower thermal conductivity than the casing 60. Therefore, less heat is conducted through the spacers 30 to the base 40, and thus the amount of the heat reaching the casing 60 can be reduced. Further, since the spacers 30 are provided between the manifold 16 and the base 40, the base 40 does not directly contact with the manifold 16. Therefore, less heat in the manifold 16 is conducted to the base 40 and further to the casing 60.

(3) The casing 60 is made of an aluminum alloy. On the other hand, the base 40 is made of a stainless steel having a lower thermal conductivity than the casing 60. Therefore, less heat is conducted through the base 40 to the casing 60, and thus the amount of the heat reaching the casing 60 can be reduced.

(4) In the casing 60, the side wall 64 has a smaller thickness than the bottom wall 62, thereby reducing its heat conductivity. Within the casing 60, the heat from the manifold 16 is first conducted to the side wall 64. In this way, among the walls of the casing 60, the wall first to receive the heat conducts less heat, and therefore, it is possible to inhibit the heat from being conducted to the other portions of the casing 60.

(5) The bosses 70 are spaced apart from the edge 62A of the bottom wall 62 of the casing 60, and thus the shortest distance 60L between each of the bosses 70 and the edge 62A of the bottom wall 62 is maintained properly. This distance determines the length of the path of the heat from the edge 62A of the bottom wall 62 to the bosses 70. Because of this distance, less heat reaches the circuit portion 50.

(6) Since the base 40 is interposed between the manifold 16 and the casing 60, it can be prevented that the radiation heat from the manifold 16 is conducted directly to the interior of the casing 60 via the ambient atmosphere. Moreover, the spacers 30 are interposed between the manifold 16 and the base 40. The base 40 is spaced apart from the manifold 16 by the length of the spacers 30. Accordingly, the radiation heat conducted from the manifold 16 and reaching the base 40 can be reduced in accordance with the distance from the manifold 16 to the base 40.

(7) The heat insulator 80 is disposed in the casing 60 at a position closer to the opening 68, and thus the amount of the radiation heat conducted from the manifold 16 and reaching the circuit portion 50 can be reduced.

(8) The distance Z between the outer surface of the manifold 16 and the distal end surfaces of the bosses 70 is larger than the projection length 70L of the bosses 70 from the bottom wall 62 of the casing 60. Accordingly, the circuit portion 50 positioned at the distal end surfaces of the bosses 70 is properly spaced apart from the manifold 16. Therefore, the amount of the radiation heat from the manifold 16 received by the circuit portion 50 can be reduced.

(9) The bottom wall 62 has a plurality of fins 90 provided thereon. The heat in the bottom wall 62 can be released through these fins 90.

(10) A plurality of through-holes 60H are provided in the side wall 64 and the bottom wall 62 of the casing 60. The heat in the casing 60 can be released to the outside through these through-holes 60H. Therefore, a temperature increase in the casing 60 can be inhibited.

The foregoing embodiment can be modified as described below. The above embodiment and the following modifications can be implemented in combination to the extent where they are technically consistent with each other.

The shape of the casing 60 is not limited to that in the above embodiment. The casing 60 may be any housing including the bottom wall 62 and the side wall 64 rising from the bottom wall 62. The casing 60 is not limited to the quadrangular box-like shape but may have a circular box-like shape, or in other words, a cylindrical shape with one end thereof closed, or a polygonal box-like shape other than a quadrangle. The bottom wall 62 is not limited to the plate-like shape but may be curved. The side wall 64 may rise obliquely so as to diverge toward the opening 68.

The material of the casing 60 is not limited to that in the above embodiment. For example, the casing 60 may be made of a stainless steel. When the casing 60 is made of a material having a properly low thermal conductivity, less heat is conducted through the side wall 64 and the bottom wall 62 of the casing 60, and thus the amount of heat conducted from the manifold 16 and reaching the circuit portion 50 can be reduced.

The positions of the bosses 70 are not limited to those in the above embodiment. The bosses 70 can be at any positions at which to project from the bottom wall 62. The bosses 70 may be positioned at the edge 62A of the bottom wall 62 in the casing 60. In this case, the heat from the manifold 16 still passes through the side wall 64 and reaches the bosses 70. The heat is radiated while it is conducted through the side wall 64, and thus the amount of heat reaching the circuit portion 50 can be reduced.

The projection length 70L of the bosses 70 are not limited to that in the above embodiment. When it is not intended to reduce the amount of the radiation heat conducted from the manifold 16 to the circuit portion 50, the projection length 70L of the bosses 70 may be larger than the distance Z between the outer surface of the manifold 16 and the distal end surfaces of the bosses 70. In this case, the bosses 70 may have any projection length 70L that is smaller than the rise length of the side wall 64. With this arrangement, the circuit portion 50 fixed to the bosses 70 are not positioned outside the casing 60.

A single boss 70 may be provided instead of the plurality of bosses 70.

The number and positions of the through-holes 60H in the casing 60 are not limited to those in the above embodiment. The through-holes 60H may be provided closer to the middle of the bottom wall 62.

The though-holes 60H may be omitted. In this case, the amount of the heat reaching the circuit portion 50 still can be reduced through the heat radiation from the outer surface of the casing 60.

The thickness 64K of the side wall 64 in the casing 60 is not limited to that in the above embodiment. The thickness 64K of the side wall 64 may be the same as or larger than the thickness 62K of the bottom wall 62. In these cases, the amount of the heat reaching the circuit portion 50 still can be reduced through the heat radiation from the outer surface of the side wall 64.

The number and the positions of the spacers 30 are not limited to those in the above embodiment. The spacers 30 may be positioned closer to the middle of the base 40.

The shape of the spacers 30 is not limited to that in the above embodiment. For example, the spacers 30 may have a polygonal tubular shape. The spacers 30 may have any shape that can be attached to the base 40 and the manifold 16.

The material of the spacers 30 is not limited to that in the above embodiment. The spacers 30 may be made of an aluminum alloy. The spacers 30 may be made of a material other than those having a lower thermal conductivity than the casing 60. Irrespective of the material of the spacers 30, the presence of the spacers 30 maintains a proper distance between the base 40 and the outer surface of the manifold 16, and thus the radiation heat conducted from the manifold 16 and reaching the base 40 can be reduced. In addition, the heat from the manifold 16 is radiated from the spacers 30 while it is conducted through the spacers 30, and thus the amount of the heat reaching the circuit portion 50 can be reduced. The plurality of spacers 30 may be made of different materials.

The spacers 30 may be omitted. The base 40 may thus be attached directly to the outer surface of the manifold 16. In this case, for example, the bolts are inserted through the flange 66 of the casing 60 and the base 40 and screwed into the manifold 16. With the base 40 attached directly to the outer surface of the manifold 16, the opening 68 of the casing 60 is also attached to the manifold 16 via the base 40 provided between the casing 60 and the manifold 16. In this arrangement, the heat from the manifold 16 still passes through the base 40 and the side wall 64 and the bottom wall 62 of the casing 60 and reaches the bosses 70. The heat is radiated while it is conducted through these walls, and thus the amount of heat reaching the circuit portion 50 can be reduced.

The material of the base 40 is not limited to that in the above embodiment. When it is not intended to inhibit the heat conduction from the manifold 16 to the casing 60, the material of the base 40 may be changed desirably. The base 40 may be made of an aluminum alloy. The base 40 may be made of a material having a higher thermal conductivity than the material of the casing 60. Irrespective of the material of the base 40, the presence of the base 40 prevents the radiation heat from the manifold 16 from being conducted directly to the interior of the casing 60. In addition, the heat from the manifold 16 is radiated from the base 40 while it is conducted through the base 40, and thus the amount of the heat reaching the circuit portion 50 can be reduced.

The shape of the base 40 is not limited to that in the above embodiment. The base 40 may have any shape that can close the opening 68 of the casing 60. The base 40 may have a polygonal plate-like shape other than a quadrangle or may have any shape other than the plate-like shape such as a rectangular parallelepiped.

When it is not necessary to prevent the radiation heat from the manifold 16 from being conducted directly to the interior of the casing 60, the base 40 may be omitted. The casing 60 may thus be attached directly to the outer surface of the manifold 16. In this case, for example, the bolts are inserted through the flange 66 of the casing 60 and screwed into the manifold 16. With the casing 60 attached directly to the outer surface of the manifold 16, the opening 68 of the casing 60 is attached directly to the manifold 16. In the arrangement without the base 40, the heat from the manifold 16 still passes through the side wall 64 and the bottom wall 62 of the casing 60 and reaches the bosses 70. The heat is radiated while it is conducted through these walls, and thus the amount of heat reaching the circuit portion 50 can be reduced.

The fins 90 may be omitted. Even without the fins 40, the heat is radiated from the outer surface of the bottom wall 62. When the fins 90 are omitted, for example, the outer surface of the bottom wall 62 may have a wavy shape with an increased surface area. The increased surface area increases the efficiency of the heat radiation from the bottom wall 62.

The material of the heat insulator 80 is not limited to that in the above embodiment.

The heat insulator 80 may be omitted.

The electronic device 20 may be attached to heating elements other than the manifold 16. The electronic device 20 may be attached to any heating elements in the aircraft actuator 10 other than the manifold 16, or it may be attached to heating elements in any constituents other than the aircraft actuator 10. The electronic device 20 may be attached to any heating elements installed on an aircraft.

The electronic device 20 may be attached to an aircraft actuator different from that in the above embodiment. For example, some aircraft actuators convert a rotational motion of a motor into a linear motion and transmit the linear motion to a rod. In such aircraft actuators, a housing containing the motor heats in accordance with the power applied to the motor. The electronic device 20 may be attached to such a housing.

The aircraft actuator 10 having the electronic device 20 attached thereto may be mounted to mounting objects other than the example in the above embodiment. The operating object may be an aileron, a rudder, or an elevator. The cylinder 12 may be mounted to different mounting objects in accordance with the operating object.

Other Embodiments

The following numbered examples are embodiments.

1. An electronic device for an aircraft, comprising:
a casing including a bottom wall and a side wall rising from the bottom wall, wherein a heating element is attached to the side wall at an opposite side to the bottom wall;
a boss projecting from the bottom wall toward the opposite side to the bottom wall with respect to the side wall;
a circuit portion fixed to a distal end surface of the boss; and
a base provided between the casing and the heating element,
wherein the base is made of a material having a lower thermal conductivity than the casing, and
wherein a distance between the heating element and the distal end surface of the boss is larger than a projection length of the boss from the bottom wall.

What is claimed is:

1. An electronic device for an aircraft, comprising:
a casing including a bottom wall and a side wall rising from the bottom wall,
wherein the casing is configured such that a heating element is retrofitted to the side wall at an opposite side to the bottom wall;
a boss projecting inwardly from the bottom wall, which is opposite to the heating element, toward the opposite side to the bottom wall with respect to the side wall, the boss including a distal end in the casing; and
a circuit portion fixed to the distal end of the boss in the casing.

2. The electronic device for an aircraft according to claim 1, further comprising a base provided between the casing and the heating element.

3. The electronic device for an aircraft according to claim 2, wherein the base is made of a material having a lower thermal conductivity than the casing.

4. The electronic device for an aircraft according to claim 2, wherein a spacer is attached to the base, and
wherein the base is attached to the heating element via the spacer.

5. The electronic device for an aircraft according to claim 4, wherein the spacer is made of a material having a lower thermal conductivity than the casing.

6. The electronic device for an aircraft according to claim 1, wherein the circuit portion is fixed to a distal end surface of the boss, and
wherein a distance between the heating element and the distal end surface of the boss is larger than a projection length of the boss from the bottom wall.

7. The electronic device for an aircraft according to claim 1, wherein a thickness of the side wall is smaller than a thickness of the bottom wall.

8. The electronic device for an aircraft according to claim 1, wherein the casing includes a though-hole communicating between an inside and an outside of the casing.

9. The electronic device for an aircraft according to claim 1, wherein the boss is positioned away from an edge of the bottom wall, and
wherein a distance between the boss and the edge of the bottom wall is larger than a projection length of the boss.

10. An electronic device for an aircraft, comprising:
a casing including a bottom wall and a side wall rising from the bottom wall, wherein a heating element is attached to the side wall at an opposite side to the bottom wall;
a boss projecting from the bottom wall toward the opposite side to the bottom wall with respect to the side wall;
a circuit portion fixed to the boss;
a base provided between the casing and the heating element; and
a spacer attached to the base,
wherein the base is attached to the heating element via the spacer.

* * * * *